United States Patent

Fassler et al.

[11] Patent Number: 6,097,416
[45] Date of Patent: Aug. 1, 2000

[54] METHOD FOR REDUCING DONOR UTILIZATION FOR RADIATION-INDUCED COLORANT TRANSFER

[75] Inventors: Werner Fassler, Rochester; Michael E. Long, Bloomfield; Michael L. Boroson, Rochester, all of N.Y.

[73] Assignee: Eastman Kodak Company, Rochester, N.Y.

[21] Appl. No.: 08/966,513

[22] Filed: Nov. 10, 1997

[51] Int. Cl.[7] .......................... B41J 17/06; B41J 25/308
[52] U.S. Cl. ............................................................. 347/215
[58] Field of Search .................................. 347/215, 213, 347/139, 153, 217, 264; 358/296; 400/224.2, 55–57, 59, 120.04, 232

[56] References Cited

U.S. PATENT DOCUMENTS

| | | | |
|---|---|---|---|
| 4,456,392 | 6/1984 | Nozaki et al. | 400/232 |
| 4,541,830 | 9/1985 | Hotta et al. | 428/143 |
| 4,600,274 | 7/1986 | Morozumi | 349/109 |
| 4,621,271 | 11/1986 | Brownstein | 347/211 |
| 4,642,628 | 2/1987 | Murata | 345/88 |
| 4,644,338 | 2/1987 | Aoki et al. | 345/92 |
| 4,678,285 | 7/1987 | Ohta et al. | 349/71 |
| 4,695,287 | 9/1987 | Evans et al. | 430/945 |
| 4,698,651 | 10/1987 | Moore et al. | 503/227 |
| 4,701,439 | 10/1987 | Weaver et al. | 503/227 |
| 4,743,582 | 5/1988 | Evans et al. | 503/227 |
| 4,753,922 | 6/1988 | Byers et al. | 418/63 |
| 4,757,046 | 7/1988 | Byers et al. | 503/227 |
| 4,769,360 | 9/1988 | Evans et al. | 503/227 |
| 4,912,083 | 3/1990 | Chapman et al. | 503/227 |
| 4,923,860 | 5/1990 | Simons | 503/227 |
| 4,942,141 | 7/1990 | DeBoer et al. | 503/227 |
| 4,948,776 | 8/1990 | Evans et al. | 503/227 |
| 4,948,777 | 8/1990 | Evans et al. | 503/227 |
| 4,948,778 | 8/1990 | DeBoer | 503/227 |
| 4,950,639 | 8/1990 | DeBoer et al. | 503/227 |
| 4,950,640 | 8/1990 | Evans et al. | 503/227 |
| 4,952,552 | 8/1990 | Chapman et al. | 503/227 |
| 4,957,898 | 9/1990 | Weber | 503/227 |
| 4,973,572 | 11/1990 | DeBoer | 428/195 |
| 4,975,410 | 12/1990 | Weber et al. | 430/495.1 |
| 4,988,665 | 1/1991 | Weber et al. | 359/885 |
| 5,036,040 | 7/1991 | Chapman et al. | 430/200 |
| 5,193,007 | 3/1993 | Yokoyama et al. | 347/215 |
| 5,309,329 | 5/1994 | Thiel et al. | 359/885 |
| 5,369,422 | 11/1994 | Yoshida et al. | 347/215 |
| 5,555,102 | 9/1996 | Dalton | 358/456 |
| 5,910,813 | 6/1999 | Fassler et al. | 347/215 |

*Primary Examiner*—N. Le
*Assistant Examiner*—Anh T. N. Vo
*Attorney, Agent, or Firm*—Raymond L. Owens

[57] ABSTRACT

A method of transferring colorant from a moving colorant donor element with reduced donor element usage includes providing at least one radiation transfer head for applying radiation to the moving colorant donor element; positioning a receiver relative to the radiation transfer head to provide a gap therebetween; and moving the receiver relative to the radiation transfer head through the gap so that it has a velocity different than that of the moving colorant donor element, whereby colorant is transferred from the moving colorant donor element in response to applied radiation from the radiation transfer head.

5 Claims, 6 Drawing Sheets

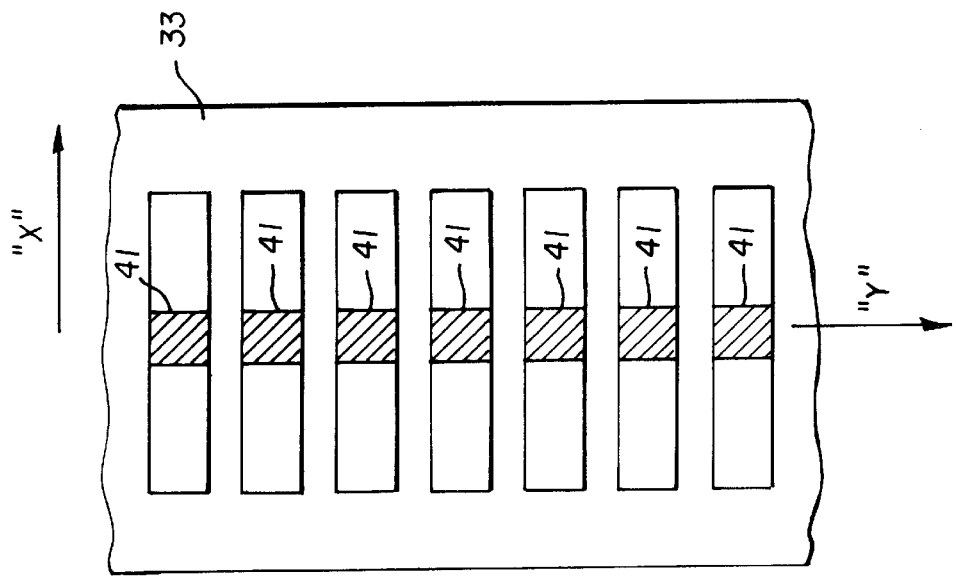
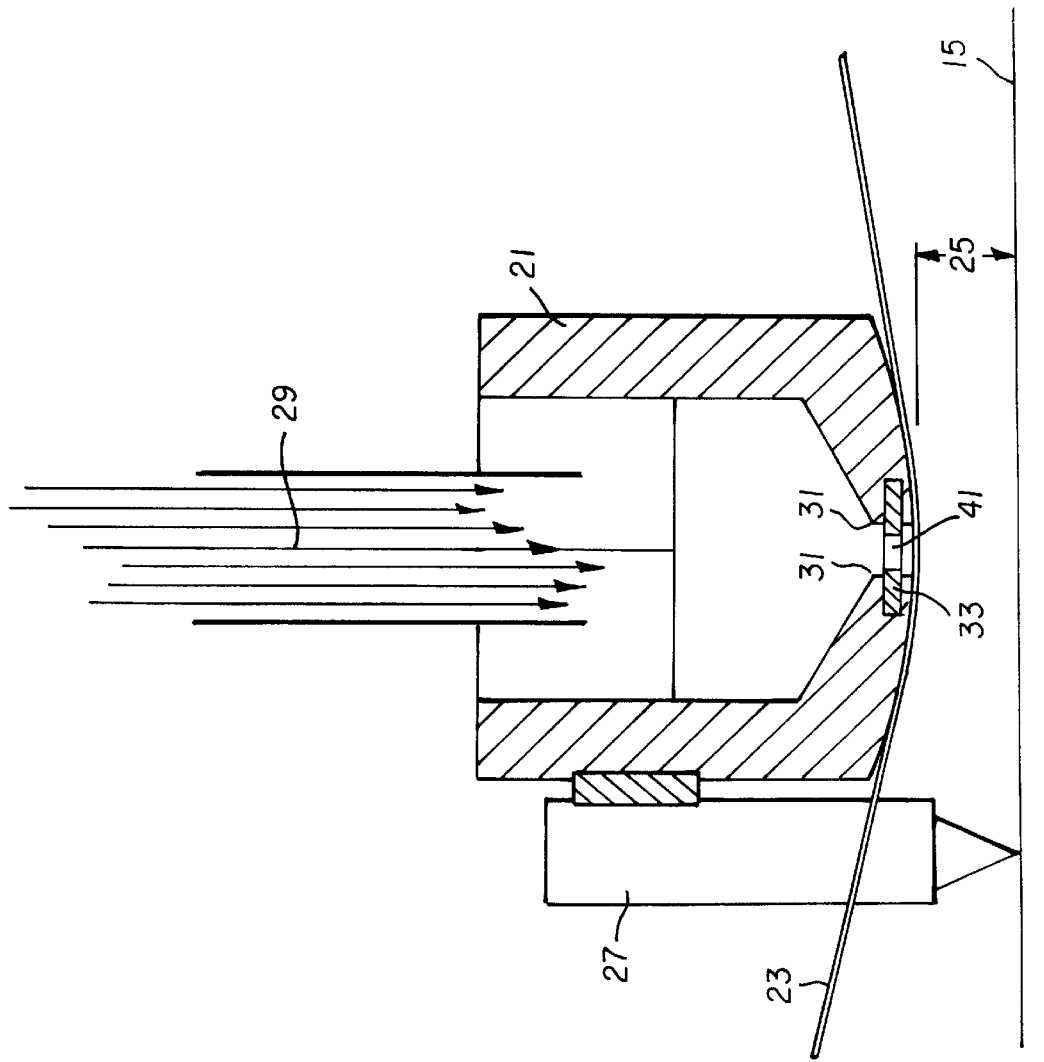

METHOD FOR REDUCING DONOR UTILIZATION FOR RADIATION-INDUCED COLORANT TRANSFER

CROSS REFERENCE TO RELATED APPLICATION

Reference is made to commonly assigned U.S. patent application Ser. No. 08/846,692 filed Apr. 30, 1997, entitled "Accurately Locating Color Donor Element In Making Color Filter Array", by Fassler et al, the disclosure of which is incorporated herein.

FIELD OF THE INVENTION

This invention relates to a method for reducing donor utilization in response to radiation-induced colorant transfer.

BACKGROUND OF THE INVENTION

In recent years, radiation transfer systems have been developed to obtain prints from pictures which have been generated electronically from a color video camera; to obtain a color proof image before a printing press run is made; to form patterns on substrates for electronic, optical, and magnetic devices; and to form color filter arrays.

According to one way of obtaining prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face and in contact with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta or yellow signal. The process is then repeated for the other two colors. A color hard copy is thus obtained which corresponds to the original picture viewed on a screen. Further details of this process and an apparatus for carrying it out are contained in commonly assigned U.S. Pat. No. 4,621,271, the teaching of which is hereby incorporated by reference. A method for reduction of donor utilization in this contact thermal printing method is described in U.S. Pat. No. 5,555,102, the disclosure of which is incorporated herein by reference. Other methods to reduce donor utilization in dye diffusion printing are known in the art, and include the use of differential donor to receiver speeds. The problem with these methods is that in dye diffusion printing there is contact between the donor and receiver, which results in high frictional forces acting on the donor in the printhead location. This can result in poor density control, donor wrinkling and tearing.

SUMMARY OF THE INVENTION

It is the object of this invention to provide an effective method of reducing the amount of donor used to print a radiation-induced colorant transfer image.

This object is achieved by a method of transferring colorant from a moving colorant donor element with reduced donor element usage, comprising the steps of:

a) providing at least one radiation transfer head for applying radiation to the moving colorant donor element;

b) positioning a receiver relative to the radiation transfer head to provide a gap therebetween; and c) moving the receiver relative to the radiation transfer head through the gap so that it has a velocity different than that of the moving colorant donor element, whereby colorant is transferred from the moving colorant donor element in response to applied radiation from the radiation transfer head.

It is an advantage of the present invention to provide a method capable of reducing donor utilization in radiation induced printing. This method provides for cost reduction in radiation induced printing while maintaining good image quality. It also eliminates the problems of density control, donor wrinkling and tearing found in dye diffusion printing.

Another advantage is that the present method is particularly suitable for forming color filter arrays which can be used in liquid crystal display devices, although it is readily applicable to other uses of thermal image printing.

BRIEF DESCRIPTION OF THE DRAWINGS

FIG. 2 is a cross-sectional view of a shaped donor head assembly which can be used in accordance with the present invention;

FIG. 3 an optional mask that can be used to define the pixels of a color filter array;

DETAILED DESCRIPTION OF THE INVENTION

Figure 1:
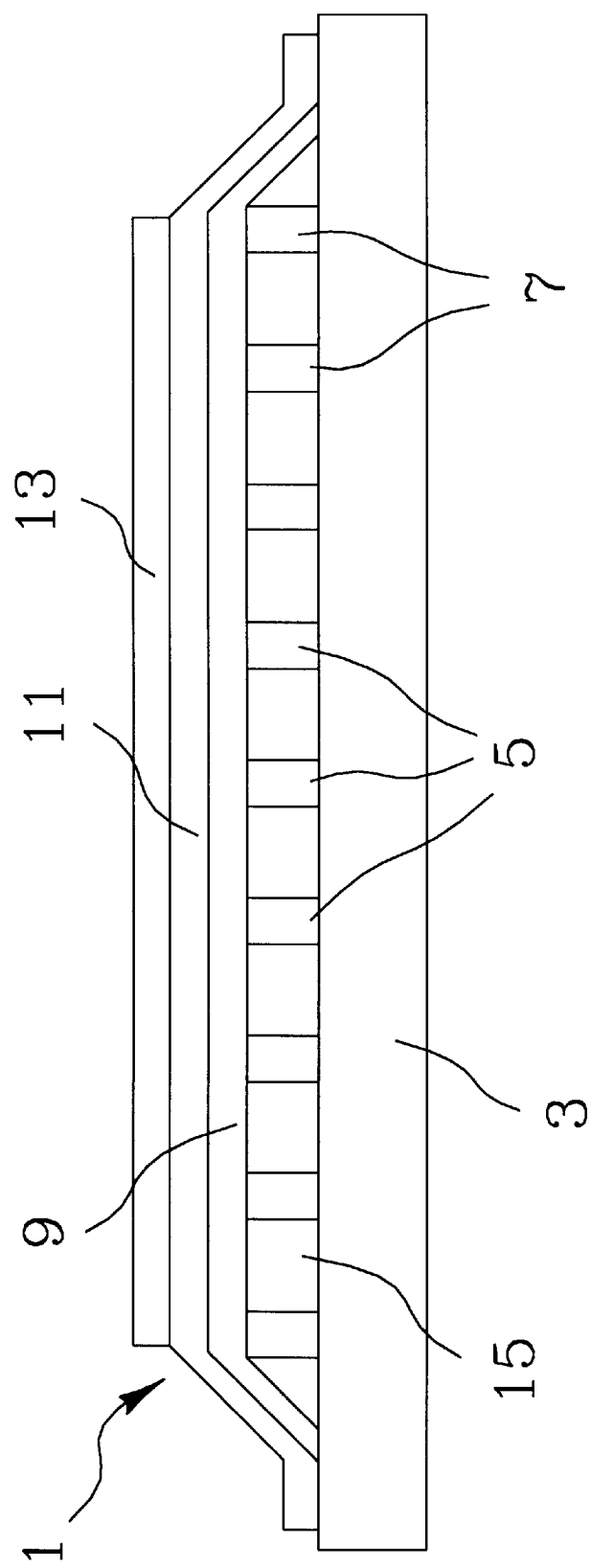
FIG. 1 is a cross-sectional view of a color filter array made in accordance with the present invention.

Various methods can be used to transfer colorant from the colorant donor element to the image-receiving element to make the radiation-induced colorant transfer image of the invention. For example, a high intensity light flash from a xenon filled flash lamp can be used with a colorant donor element containing an radiation absorptive material such as carbon black or a light-absorbing dye. This method is more fully described in commonly-assigned U.S. Pat. No. 4,923,860, the disclosure of which is incorporated herein by reference.

In another embodiment of the invention, the radiation is supplied by means of a laser, using a colorant donor element comprising a support having thereon a colorant transfer layer and an absorbing material for the wavelength of the laser.

To obtain the radiation-induced colorant transfer image employed in the invention, a diode laser is preferably employed since it offers substantial advantages in terms of its small size, reduced cost, stability, reliability, ruggedness, and ease of modulation. In practice, before any laser can be used to heat a colorant donor element, the element must contain an absorbing material, such as carbon black, cyanine infrared absorbing dyes for an infrared laser as described in U.S. Pat. No. 4,973,572, or other materials as described in the following U.S. Pat. Nos.: 4,948,777; 4,950,640; 4,950,639; 4,948,776; 4,948,778; 4,942,141; 4,952,552; 4,912,083; 4,942,141; 4,952,552; 5,036,040; and U.S. Pat. No.

4,912,083, the disclosures of which are hereby incorporated by reference. The laser radiation is then absorbed into the colorant layer and converted to heat by a molecular process known as internal conversion. Thus, the construction of a useful colorant layer will depend not only on the hue, transferability and intensity of the image colorants, but also on the ability of the colorant layer to absorb the radiation and convert it to heat. The infrared-absorbing material may be contained in the colorant layer itself or in a separate layer associated therewith.

Lasers which can be used to transfer colorant from colorant donor elements employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described in commonly assigned U.S. Pat. No. 5,168,288, the teaching of which is hereby incorporated by reference.

A useful color filter array should have good thermal resistance, so that subsequent high temperature processing steps such as vacuum sputtering of conducting layers and curing of polymeric alignment layers will not degrade the color quality of the pixel elements of the array. The colorants of the pixel elements of the array should also be chosen to have good fade resistance to the viewing light that illuminates them. The colorants must have good color purity, and the overall transmissivity of the color filter array should be as high as possible, consistent with good color purity and saturation, so that the power of the illuminating lamp need not be excessively high. Additional requirements on the color filter array are that the resolution of the array be high, so that the images appear sharp and detailed to the eye, and the overall uniformity of the image be good. In addition, point defects such as missing pixels (pixel drop-outs) must not occur in a uniform array image.

As noted above, the image-receiving layer contains a repeating pattern of colorants, and in a preferred embodiment of the invention, the pattern consists of a set of red, green, and blue additive primaries.

In another preferred embodiment of the invention, each area of primary color and each set of primary colors are separated from each other by an opaque area, e.g., black grid lines. This has been found to give improved color reproduction and reduce flare in the displayed image, and protect photosensitive electronics from light.

The size of the colored pattern set is not critical since it depends on the viewing distance. In general, the individual pixels of the set are from about 50 to about 600 microns and do not have to be of the same size.

In a preferred embodiment of the invention, the repeating pattern of colorant to form the color filter array element consists of uniform, square, linear repeating areas as follows:

| B R G B R G |
| B R G B R G |
| B R G B R G |

The color filter array elements prepared according to the invention can be used in image sensors or in various electro-optical devices such as electroscopic light valves or liquid crystal display devices. Such liquid crystal display devices are described, for example, in U.K. Patents 2,154,355; 2,130,781; 2,162,674; and 5 2,161,971.

Liquid crystal display devices are commonly made by placing a material, which is liquid crystalline at the operating temperature of the device, between two transparent electrodes, usually indium tin oxide coated on a substrate such as glass, and exiting the device by applying a voltage across the electrodes. Alignment layers are provided over the transparent electrode layers on both substrates and are treated to orient the liquid crystal molecules in order to introduce a twist of, e.g., 90°, between the substrates. Thus, the plane of polarization of plane polarized light will be rotated in a 90° angle as it passes through the twisted liquid crystal composition from one surface of the cell to the other surface. Application of an electric field between the selected electrodes of the cell causes the twist of the liquid crystal composition to be temporarily removed in the portion of the cell between the selected electrodes. By use of optical polarizers on each side of the cell, polarized light can be passed through the cell or extinguished, depending on whether or not an electric field is applied.

The polymeric alignment layer described above can be any of the materials commonly used in the liquid crystal art. Examples of such materials include polyimides, polyvinyl alcohol, and methyl cellulose.

The transparent conducting layer described above is also conventional in the liquid crystal art. Examples of such materials include indium tin oxide, indium oxide, tin oxide, and cadmium stannate.

FIG. 1 shows a cross sectional schematic of a color filter array 1 made in accordance with the present invention which can be used in a liquid crystal display device (not shown). The color filter array 1 includes a rigid transparent support 3 formed of glass, plastic, or other suitable material. The color filter array 1 includes red (R), green (G), and blue (B) color cells or pixels cells 5 embedded in a polymer-image receiving layer 15. It will be understood to those skilled in the art that other colors, such as cyan, magenta and yellow can also be used. Black grid lines 7 separate each color pixel. The color filter array 1 has a polymeric protective overcoat layer 9 and also can be coated with a transparent conducting layer of suitable material such as indium tin oxide (ITO) 11. When used in a liquid crystal device (LCD) an alignment layer 13 is used.

Turning now to FIG. 2 shows a schematic of a shaped donor head 21. The operation of the assembly is further disclosed and described in the above-identified U.S. patent application Ser. No. 08/846,692 to Fassler et al. The dye donor element 23 rides on the surface of the shaped donor head assembly which maintains a donor gap 25 between the dye donor element 23 and the surface of the polymer image-receiving layer 15. The donor gap 25 is sensed and maintained by sensor assembly 27. The radiation 29 from the radiation source is focused through head gap 31 and mask 33. Because of the provision of the donor gap 25 between the shaped donor head 21 and the polymer image-receiving layer 15 the present invention has an advantage in that the speed and direction of dye donor element 23 and the polymer image-receiving layer 15 can be independent of each other. The polymer-image receiving layer 15 and the dye donor element 23 can either be moved continuously or with an intermittent stepping motion. The dye donor element 23 can be provided with dye having a density that permits reuse of the dye donor element 23. In other words, a single pass of the dye donor element 23 will leave sufficient dye so that one or more new images can be printed using the same portion of the dye donor element 23.

The mask 33 is more fully described in FIG. 3 and can be made of etched chromium on glass or etch metal as is well known in the art. As shown in FIG. 3, the transparent regions 41 of the mask 33 can be used to more fully restrict the radiation 29 and define the printed pixels. The laser source is described in the above-identified U.S. patent application Ser. No. 08/846,692 to Fassler et al. The flash assembly for the laser source is more fully described in commonly assigned U.S. Pat. No. 5,309,329, the teaching of which is incorporated herein by reference.

The dye-donor element, 23, used to form the color filter array 1 of a preferred embodiment of the invention includes a support having thereupon a dye layer. Any dye or mixtures of dyes can be used in such a layer provided they are transferable to the dye image-receiving layer of the color filter array element of the invention by the action of intense light. Especially good results have been obtained with sublimable dyes. Examples of sublimable dyes include anthraquinone dyes, e.g. Sumikalon Violet RS® (Sumito Chemical Co., Ltd.); Dianix Fast Violet 3R-FS® (Mitsubishi Chemical Industries, Ltd.); and Kayalon Polyol Brilliant Blue N-BGM®; Kayalon Polyol Dark Blue 2BM®; and KST Black KR® (Nippon Kayaku Co., Ltd.); Sumickaron Diazo Black 5G® (Mitsui Toatsu Chemicals, Inc.); direct dyes such as Direct Dark Green B® (Mitsubishi Chemical Industries, Ltd.); and Direct Brown M® and Direct Fast Black D® (Nippon Kayaku Co., Ltd.); acid dyes such as Kayanol Milling Cyanine 5R® (Nippon Kayaku Co., Ltd.); basic dyes such as Sumicacryl Blue 6G® (Sumitomo Chemical Co., Ltd.); and Aizen Malachite Green® (Hodogaya Chemical Co., Ltd.); or any of the dyes disclosed in U.S. Pat. Nos. 4,541,830; 4,698,651; 4,695,287; 4,701, 439; 4,757,046; 4,743,582; 4,769,360; and U.S. Pat. No. 4,753,922, the disclosure of which are hereby incorporated by reference.

Suitable dyes are further illustrated by the following structural formulae:

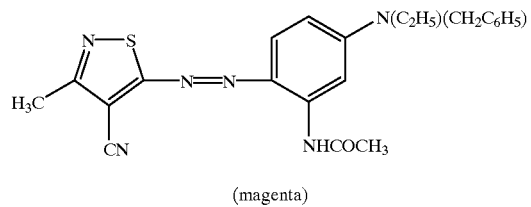
(magenta)

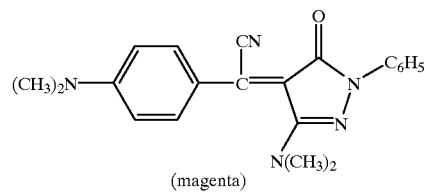
(magenta)

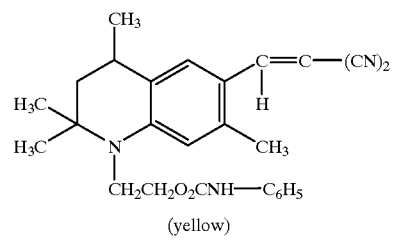
(yellow)

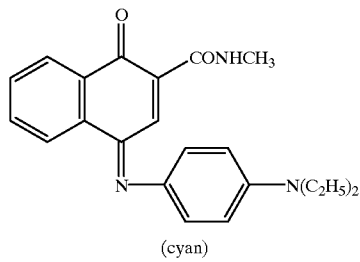
(cyan)

The above subtractive dyes can be employed in various combinations to obtain the desired red, blue, and green additive primary colors, as disclosed in U.S. Pat. Nos. 4,957,898; 4,975,410; and U.S. Pat. No. 4,988,665, the disclosures of which are hereby incorporated by reference. The dyes can be mixed within the dye layer or transferred sequentially if coated in separate dye layers and can be used at a coverage of from about 0.05 to about 1 g/m2.

Various methods can be used to transfer dye from the dye donor element 23 to polymer image receiving layer 15. Further details of these methods are more fully described in U.S. Patent No. 4,923,860, the disclosure of which is incorporated herein by reference.

Figure 4A:
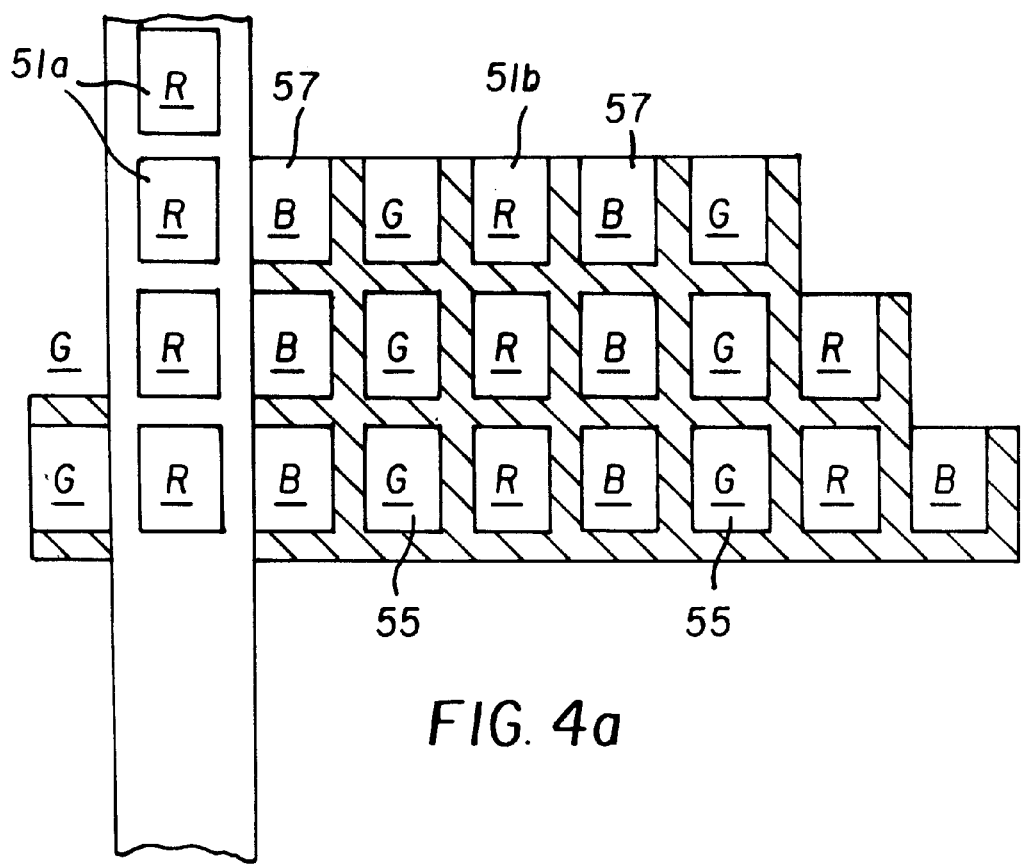
FIGS. 4a and 4b are schematics that show a color filter array pattern having an in-line pixel arrangements.
Figure 4B:
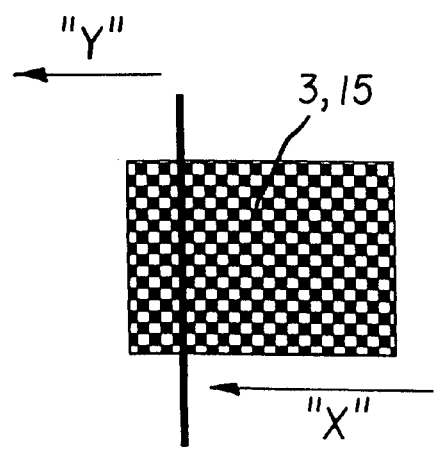

FIGS. 4a and 4b show schematically the practice of the above described invention to achieve reduced donor utilization showing the top view of the color filter array 1. In FIG. 4a, the head 21 is shown schematically as a darkened line and the arrow shows the direction of movement of the polymer image receiver 15. As the polymer image receiver 15 moves, a first row of red pixels 51a (see FIG. 4a) are printed in the X direction. These red pixels 51a are printed either in the X direction first, or sequentially, using a laser as the radiation source, or in parallel using high intensity such as flash as the radiation source. Then the rigid transparent support 3 and the coated polymer image receiver 15 are moved in the Y direction three steps to print the next row of red pixels 51b. Since the dye donor element 23 and the polymer image receiver 15 are moved at different velocities, these velocities can be selected to reduce donor utilization. The dye donor element 23 is only moved sufficiently to make available a portion of unexposed material, thus reducing donor utilization by approximately one third over previously disclosed methods. Subsequent printing of the green 55 and blue 57 rows of pixels is done with green and blue dye donor elements using the same printing method as described above for the red. This also reduces the green and blue dye donor utilization by one third.

Figure 5A:
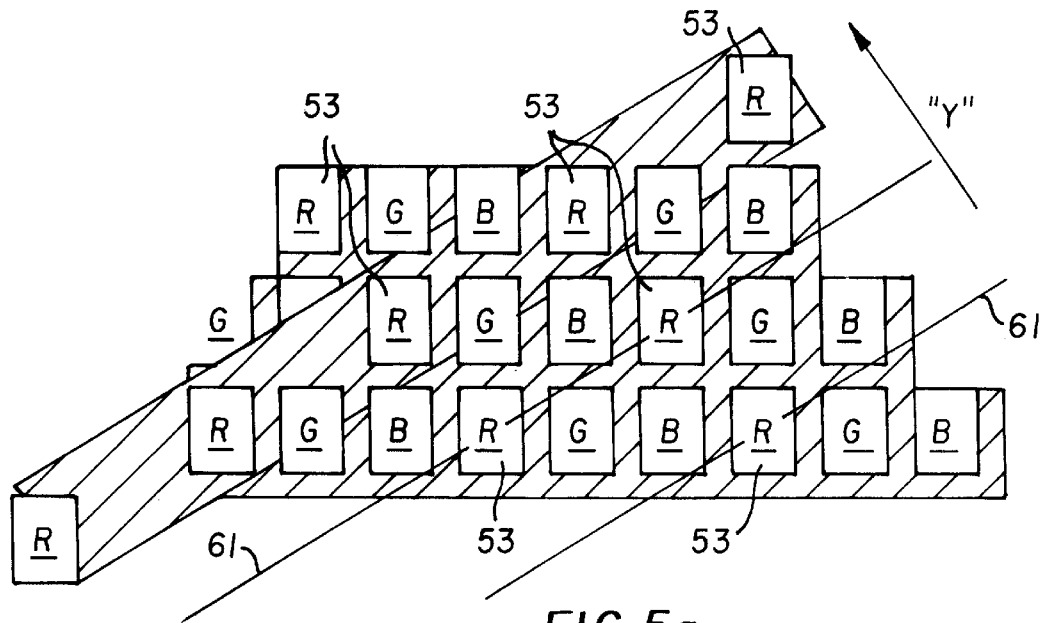
FIGS. 5a and 5b show a color filter array pattern having a staggered pixel arrangement.
Figure 5B:
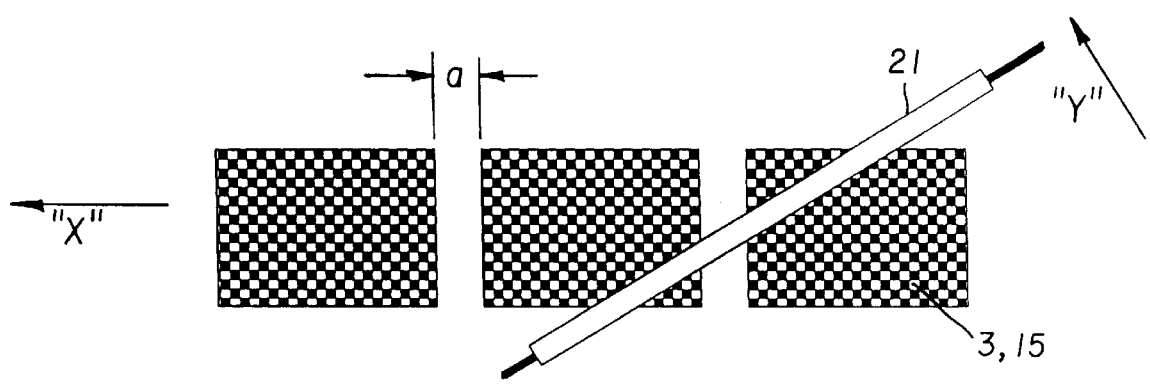

Another possible configuration of pixels is shown in FIGS. 5a and 5b. In this configuration, the pixels are arranged in a staggered pattern and the red pixels 53 are printed first in diagonal 61. The dye donor element 23 is moved in the Y direction. Then the rigid transparent support 3 and the polymer image receiver 15 are moved in the X direction. However, the dye donor element 23 is only moved sufficiently to make available a portion of unexposed material, thus reducing donor utilization by approximately one third over previously disclosed methods. The same procedure is used to print the red pixels in diagonal 61. Hence, as before, only one third the amount of dye donor element 23 is used to print the red pixels. The process as described is then repeated with green and blue dye donor elements, again using only one third of the material as previously disclosed. It is also possible to improve throughput by overlapping the printing of the color filter arrays as shown in FIG. 5*b*.

Figure 6A:
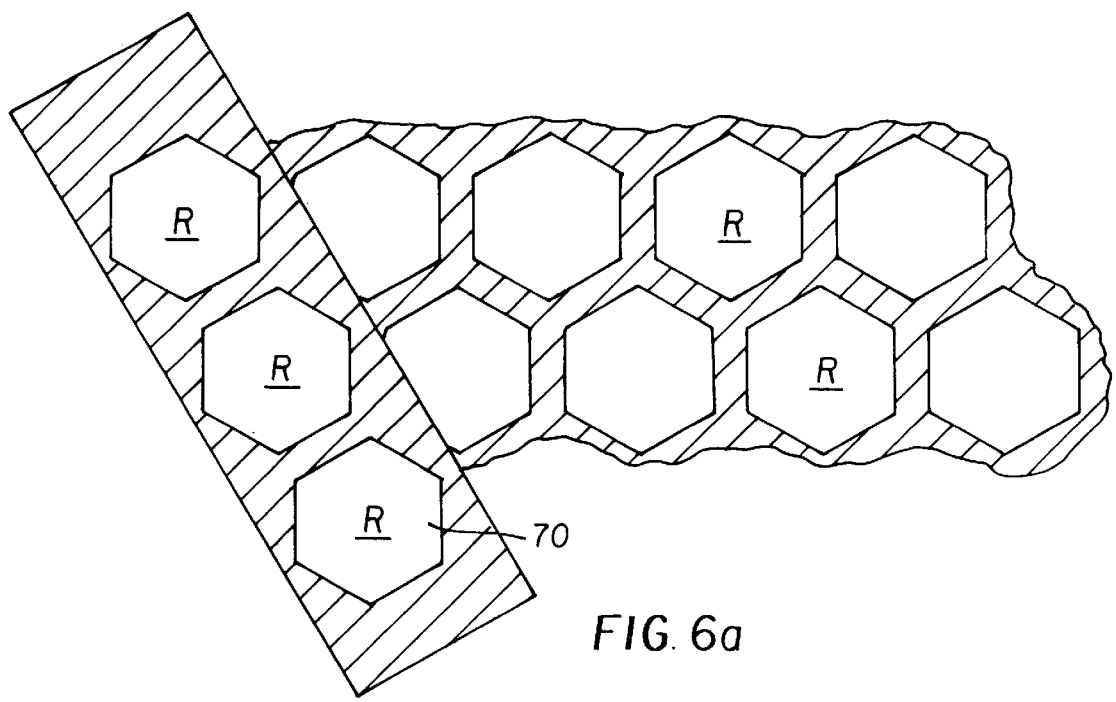
FIGS. 6a and 6b shows a color filter array pattern with hexagonal pixels.
Figure 6B:
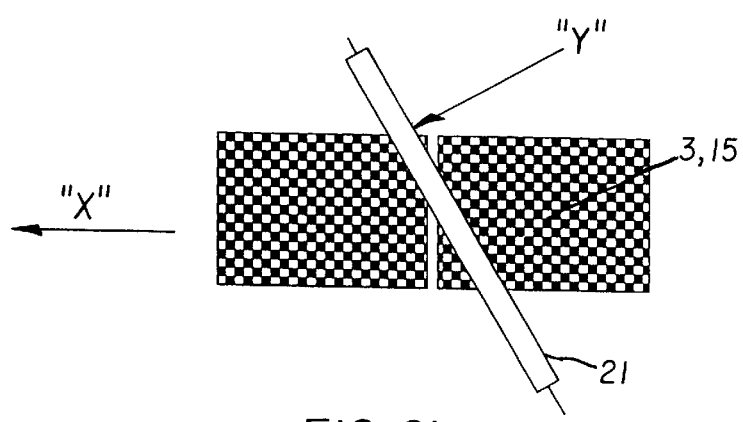

FIGS. 6*a* and 6*b* demonstrates the printing of hexagonal pixels again using a mask 33 with hexagonal openings 70, to print the pixels in staggered array similar to what is described above for FIGS. 5*a* and 5*b*. Again it is possible to increase the effective utilization (low donor utilization) of dye donor element 23 by printing in the X direction and moving the dye donor element 23 in the Y direction.

Figure 7:
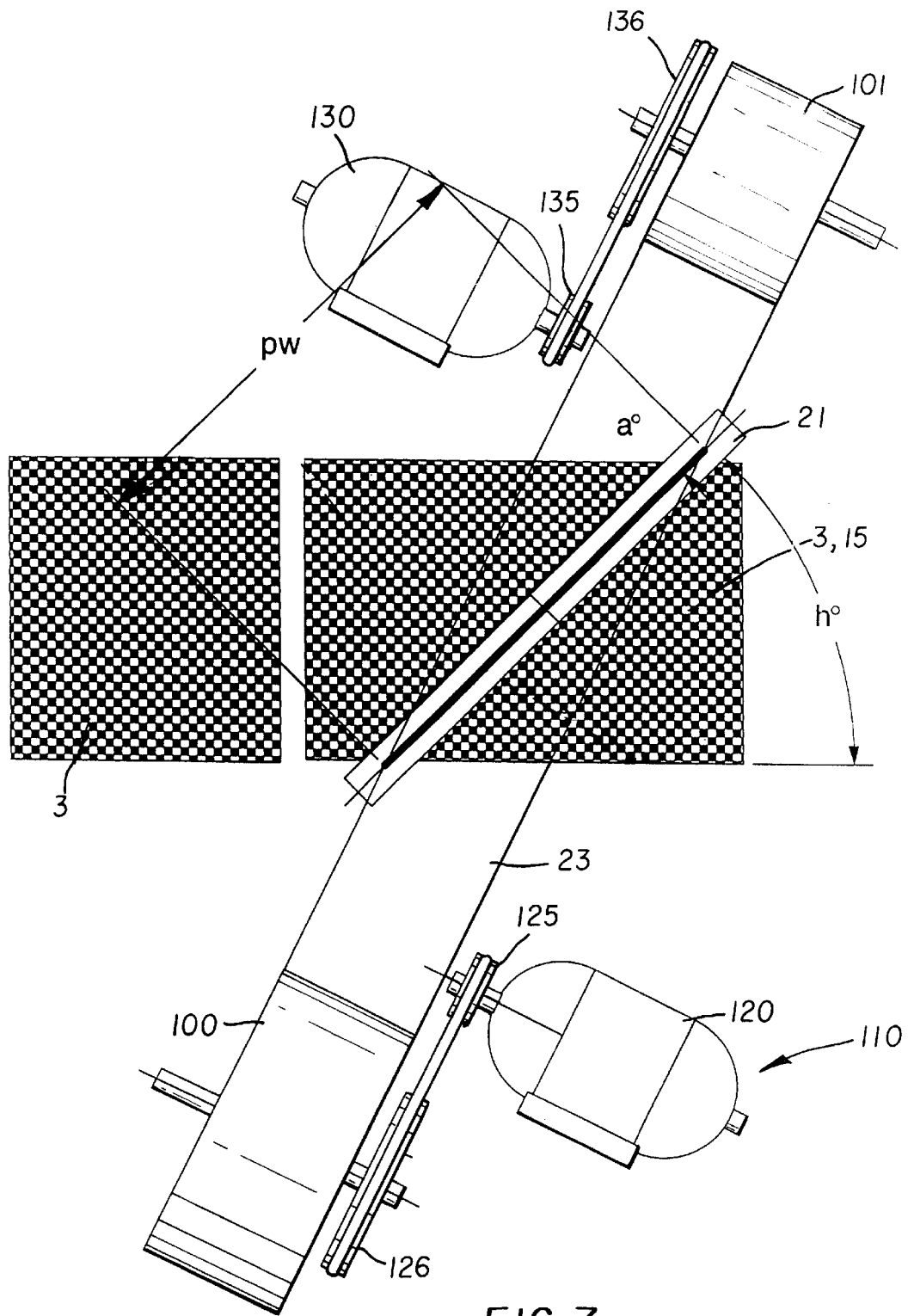
FIG. 7 shows the process of making the color filter array of FIG. 1 using a helical wrap which permits printing a color filter array with a larger dimension than the width of the dye donor element.

FIG. 7 illustrates a helical wrap method which permits the same dye donor element width to be used to print various sizes of different print widths (pw) of color filter arrays. This is accomplished by wrapping the dye donor element 23 around the donor head 21 with an angle a°, to the donor edge and an angle h° to receiver layer edge. The dye donor element 23 is moved at a rate sufficient to present unused material to the head 21. The motion of the dye donor element 23 will be less than the motion of the rigid transparent support 3 that carries the polymer image receiver 15. Further a donor supply spool 100, and a take-up spool 101 are used for the dye donor element 23 transport. Also shown is one of many possible mechanisms to unspool and take-up the used portion of the dye donor element 23. The spool out mechanism 110, is composed of an electric motor 120, and a timing belt drive with two pulleys 125 and 126. The take-up mechanism is likewise constructed with an electric motor 130, and two pulleys 135 and 136.

The invention has been described in detail with particular reference to certain preferred embodiments and format of pixels thereof, but it will be understood that variations and modifications can be effected within the spirit and scope of the invention. In the above discussion, thermally transferred dyes were used, although other colorants such as, for example, pigments, or dichroic layers as discussed above.

PARTS LIST

1 color filter array
3 rigid transparent support
5 color cells or pixel cells
7 black grid lines
9 polymeric protective overcoat layer
11 ITO
13 alignment layer
15 polymer image-receiving layer
21 shaped donor head
23 dye donor element
25 donor gap
27 sensor assembly
29 radiation
31 head gap
33 mask
41 transparent regions
43 printed pixels
45 direction A
47 direction B
51 rows of red pixels
53 individual red pixels
55 rows of green pixels
57 rows of blue pixels
61 row
63 row
65 row
67 row

What is claimed is:

1. A method of transferring colorant from a moving colorant donor element, comprising the steps of:

a) providing at least one radiation transfer head for applying radiation to the moving colorant donor element;

b) positioning a receiver relative to the radiation transfer head to provide a gap therebetween; and (c) moving the receiver relative to the radiation transfer head through the gap and moving the colorant donor element in a helical fashion, whereby the colorant is transferred from the moving colorant donor element in response to applied radiation from the radiation transfer head in a pattern having a greater width than that of the colorant donor element.

2. A method of making a color filter array by using colorant from a moving colorant donor element with reduced donor element usage, comprising the steps of:

a) providing at least one radiation transfer head for applying radiation to the moving colorant donor element;

b) positioning a receiver relative to the radiation transfer head to provide a gap therebetween; and c) positioning the moving colorant donor element in image forming relationship with the radiation transfer head and moving the colorant donor element in a helical fashion and moving the receiver relative to the radiation transfer head through the gap so that it has a velocity different than that of the moving colorant donor element, whereby the colorant is transferred from the moving colorant donor element to the receiver in a pattern having a greater width than that of the dye donor element.

3. The method of claim 2 wherein the colorant donor element includes thermally transferable dyes and wherein the radiation is applied by a laser light radiation source to the radiation transfer head.

4. The method of claim 2 wherein the radiation is applied by a high intensity flash.

5. The method of claim 2 wherein the radiation source is a laser.

* * * * *